United States Patent [19]

Ohya et al.

[11] Patent Number: 5,568,679
[45] Date of Patent: Oct. 29, 1996

[54] METHOD OF MANUFACTURING LAMINATED PIEZOELECTRIC ACTUATOR HAVING CAVITY

[75] Inventors: Kazumasa Ohya; Masako Inagawa; Masahiro Miyauchi, all of Tokyo, Japan

[73] Assignee: NEC Corporation, Tokyo, Japan

[21] Appl. No.: 360,112

[22] Filed: Dec. 20, 1994

[30]     Foreign Application Priority Data

Dec. 20, 1993 [JP] Japan .................................. 5-320661

[51] Int. Cl.⁶ .................................................. H04R 17/00
[52] U.S. Cl. ........................ 29/25.35; 204/479; 204/485; 310/340; 310/366
[58] Field of Search ...................... 29/25.35; 310/323, 310/328, 340, 366; 204/471, 479, 485, 490, 491

[56]          References Cited

U.S. PATENT DOCUMENTS 4,681,667  7/1992  Utsumi et al. ........................ 204/491
5,163,209  11/1992  Harida et al. ........................ 29/25.35
5,191,688  3/1993  Takizawa et al. ...................... 29/25.35
5,254,212  10/1993  Someji et al. ....................... 29/25.35 X

FOREIGN PATENT DOCUMENTS 61-15382  1/1986  Japan .

*Primary Examiner*—S. Thomas Hughes
*Attorney, Agent, or Firm*—Young & Thompson

[57]          ABSTRACT

After forming a cavity in a laminated body of a plurality of piezoelectric ceramic films and internal electrodes, an insulator is formed on the end faces of the internal electrodes exposed on the wall surface of the cavity by electrophoretic process. According to this method, an insulator can be formed more inexpensively, in larger quantity, and with higher reliability than by the conventional method using a low pressure CVD method.

8 Claims, 6 Drawing Sheets

METHOD OF MANUFACTURING LAMINATED PIEZOELECTRIC ACTUATOR HAVING CAVITY

BACKGROUND OF THE INVENTION

1. Field of the Invention

The present invention relates to a method for manufacturing a hollow laminated piezoelectric actuator having a cavity such as a cylindrical through hole or U-shaped groove, and more particularly to a method of selective formation of an insulator on a surface of the cavity.

2. Description of the Prior Art

When the cavity is formed so as to extend in a direction crossing a plurality of piezoelectric ceramic layers and internal electrode layers, end faces of the internal electrodes are exposed to the air on the cavity wall surface. If the piezoelectric actuator in such a condition is driven by applying a direct current or a voltage approximating a direct current, then the metal constituting the internal electrodes is ionized and a bridge is formed between adjacent internal electrodes due to the so-called migration phenomenon. This phenomenon which is apt to take place especially when the piezoelectric actuator is driven under conditions of high humidity results in a serious problem as to the reliability because of the generation of an electrically short-circuited condition between the adjacent internal electrodes.

As a means for resolving the above problem, Japanese Laid-Open Patent Application No. 61-15382 proposed to form a uniform insulating film 14 consisting of silica ($SiO_2$) on the wall surface of the cavity 5 by using a low pressure CVD method as shown in FIG. 1. With this arrangement, it is possible to cover all of the end faces of the internal electrodes 2 exposed on the wall surface of the cavity 5 with the silica. Accordingly, ionization of the metal constituting the internal electrodes can be construed and the migration phenomenon can be prevented.

However, the method disclosed in the above-mentioned Application includes the following two serious problems of cost and reliability.

According to the above prior art, the silica produced by bringing $SiH_4$ and $N_2O$ into reaction at 500° C. in the low pressure CVD method is deposited to a thickness of 50 μm on the wall surface of the cylindrical cavity. This thickness becomes also a significant factor that hinders productivity.

As for the reliability problem, when a voltage is applied to the piezoelectric actuator in this condition, the piezoelectric actuator expands in its thickness direction in proportion to the applied voltage, and exerts a tensile stress on the silica film deposited uniformly on the wall surface of the cavity. Therefore, when the voltage is high, namely, when the expansion of the piezoelectric actuator is large, or when the voltage is turned on and off intermittently, the silica film tends to generate cracks due to application of a large tensile stress or a cyclic tensile stress. If cracks are generated in the silica film, the end faces of the internal electrodes on the wall surface of the cavity are exposed again, and the original purpose of enhancing the reliability is defeated.

SUMMARY OF THE INVENTION

It is therefore an object of this invention to provide a method of forming an insulator on the wall surface of a cavity provided in the interior of a laminated piezoelectric actuator in a manner which improves the cost performance and enhances the reliability.

According to the present invention, after forming a laminated body of a plurality of piezoelectric ceramic layers and internal electrode layers, a cavity is formed in the laminated body, and an insulator is formed on a internal wall surface of the cavity by using an electrophoretic process.

DESCRIPTION OF THE PREFERRED EMBODIMENTS

Figure 2A:
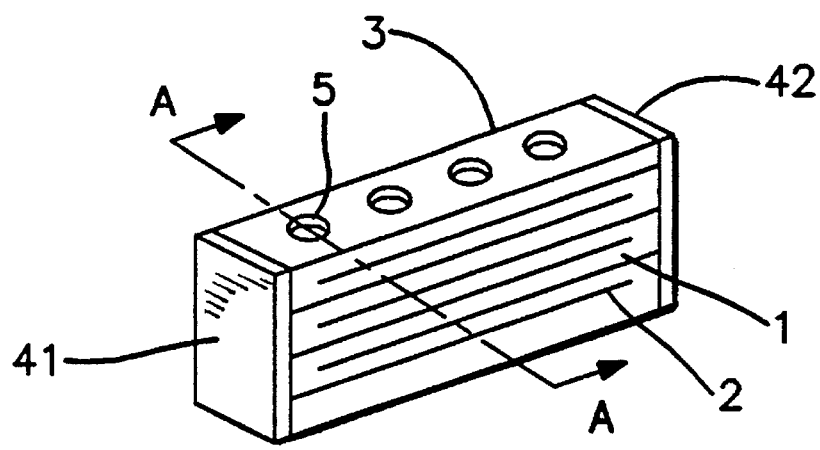
FIGS. 2A, 2B and 2C show perspective views of manufacturing steps of the present invention.
Figure 3A:
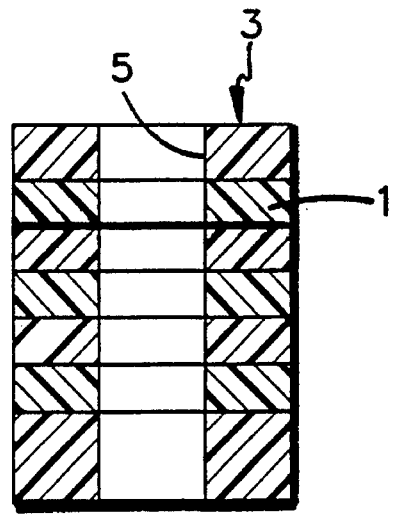
FIGS. 3A, 3B and 3C show sectional views taken along lines A—A, B—B and C—C of FIG. 2.

As shown in FIG. 2A and FIG. 3A, a plurality of piezoelectric ceramic sheets with silver-palladium paste printed on them are laminated, and this laminated body 3 in which piezoelectric ceramic sheets 1 and internal electrodes 2 are laminated is obtained by subjecting the lamination to pressing, binder removal and sintering. The laminated body 3 has a set of opposing side faces on which are exposed all of the internal electrodes, and another set of opposing side faces on which the internal electrodes of every other layer are exposed so as not to expose the internal electrodes covering both surfaces of one and the same layer. Provisional electrodes 41 and 42 of a silver paste or a conductive resin are formed on the side faces on which internal electrodes of every other layer are exposed. In addition, holes 5 are formed in the laminated body 3 by ultrasonic machining, or the like.

Figure 2B:
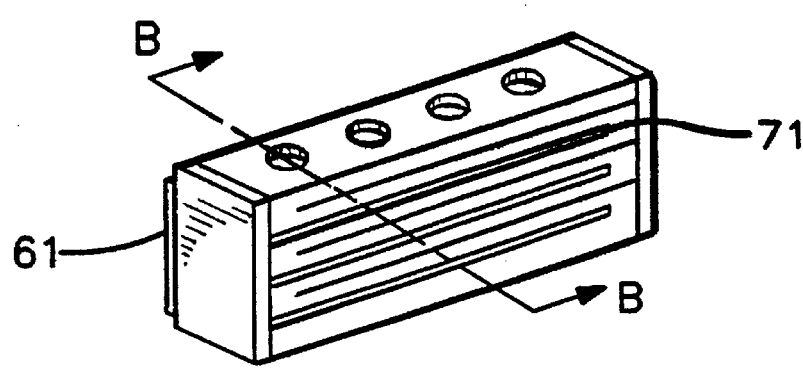
Figure 3B:
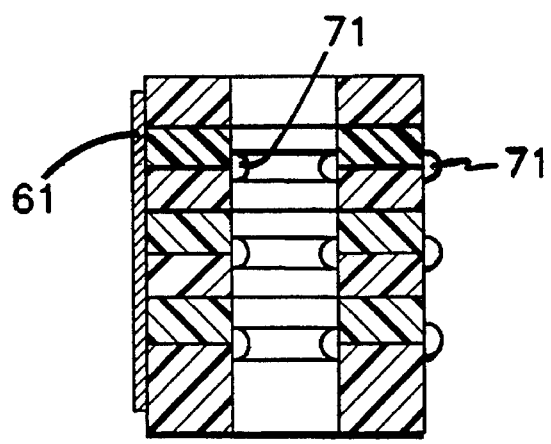
Figure 4:
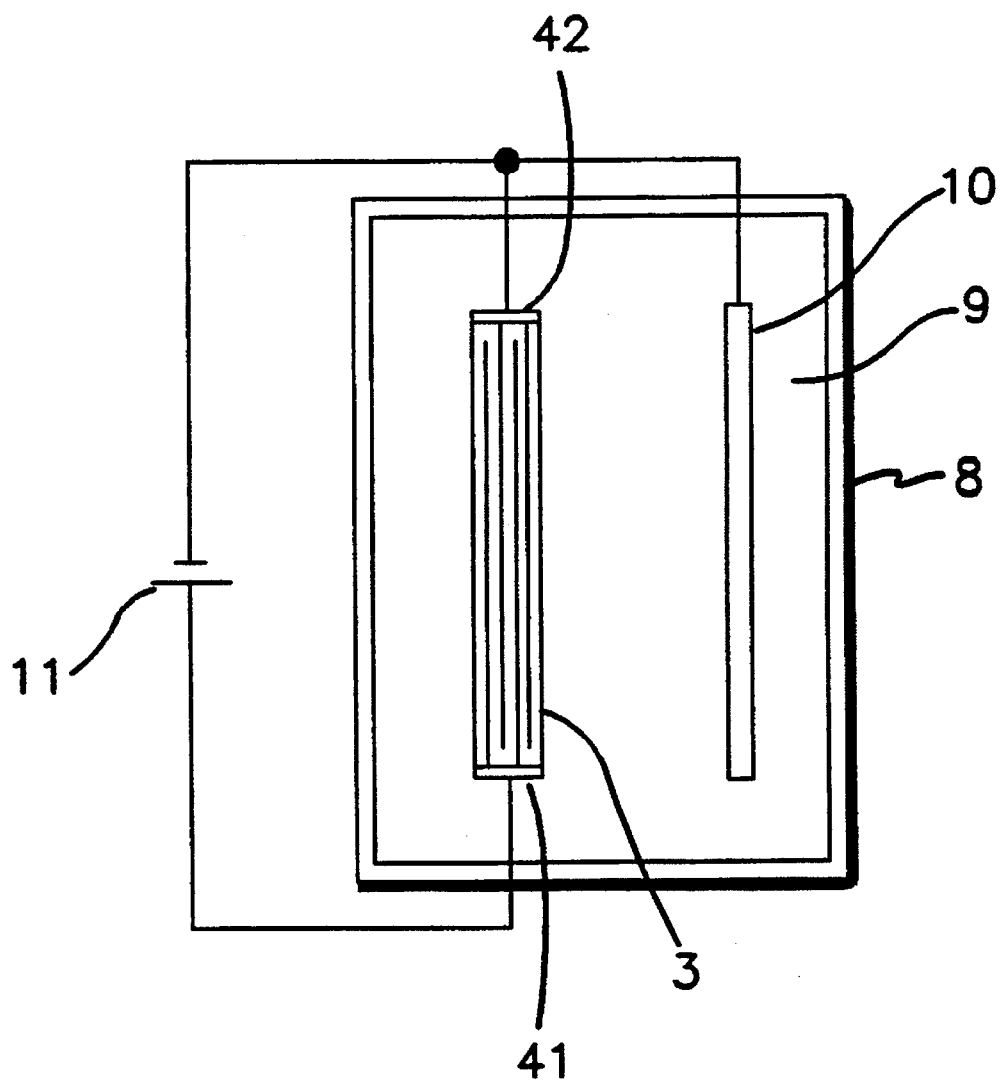
FIG. 4 is a sectional view of an example of an apparatus used for forming insulators by an electrophoretic method according to the present invention.

One of the opposing surfaces where the internal electrodes 2 of the laminated body 3 are exposed is covered with a covering material 61 such as an adhesive tape or a masking material, and an insulator 71 is formed by electrophoresis as shown in FIG. 2B. The insulator 71 is formed by immersing the laminated body 3 into a suspension 9 in a vessel 8, in which particles of insulators, such as an inorganic material like glass or ceramic, and a polymer like polyamide, polymide, fluorinated resin or epoxy resin, are dispersed, and connecting one of the provisional electrodes 41 of the laminated body 3 to a reference electrode 10 immersed similarly in the suspension as shown in FIG. 4. Here, the other provisional electrode 42 is connected to the reference electrode 10. With this arrangement, when a voltage is applied by connecting a power supply 11 between the provisional electrode 41 and the reference electrode 10, the insulator particles in the suspension 9 are set in motion by the electric field generated, and are deposited only on the internal electrodes of the laminated body 3 which are connected to the provisional electrode 41 and form the insulator 71 as shown in FIG. 2B and FIG. 3B. The method of forming an insulator in this way is generally called electrophoresis which is disclosed in the U.S. Pat. No. 4,681,667. The laminated body 3 with deposition of the insulator 71 is taken out of the suspension 9, and heated after peeling off the covering material 61 to bond the insulator 71 to the laminated body 3. In this process the insulator 71 is formed also on the inside of the holes 5.

In this embodiment, a mixed solution of acetone, in which glass powder is dispersed as insulator particles that form the insulator 71, and an electrolyte is used as the suspension 9, a voltage of 220 V is applied for 5 minutes and the insulator 71 with thickness of 50 μm is fixed by heating the laminate with a profile of holding the temperature at 650° C. for 10 minutes.

Figure 2C:
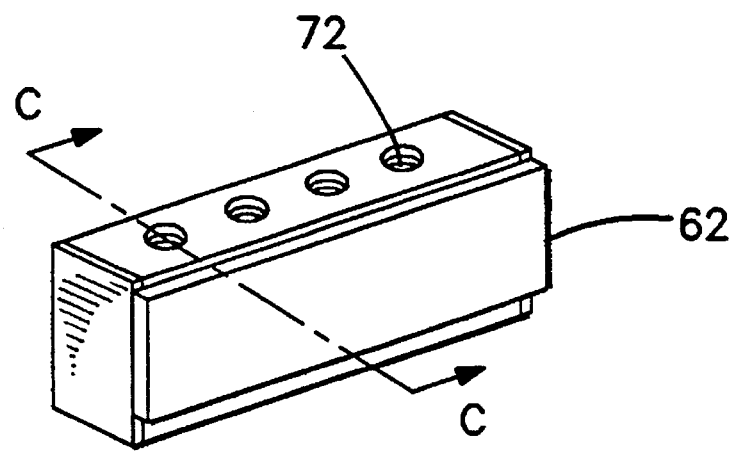
Figure 3C:
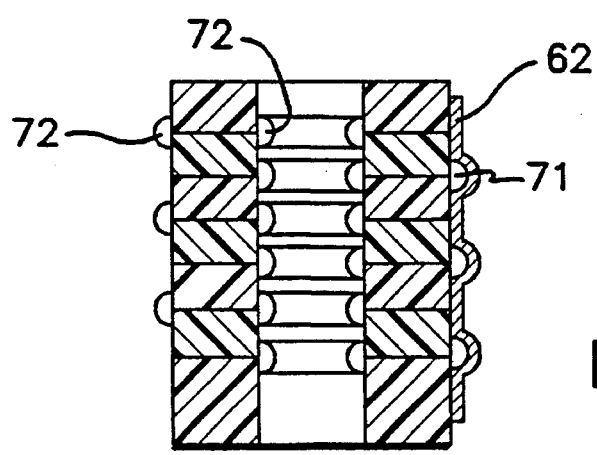

Next, as shown in FIG. 2C and FIG. 3C, a covering material 62 if formed on the surface where the insulator 71 previously formed was fixed, and an insulator 72 is formed and fixed to the laminated body 3 by applying a voltage between the reference electrode 10 and the other provisional electrode 42 as was done before.

Figure 1:
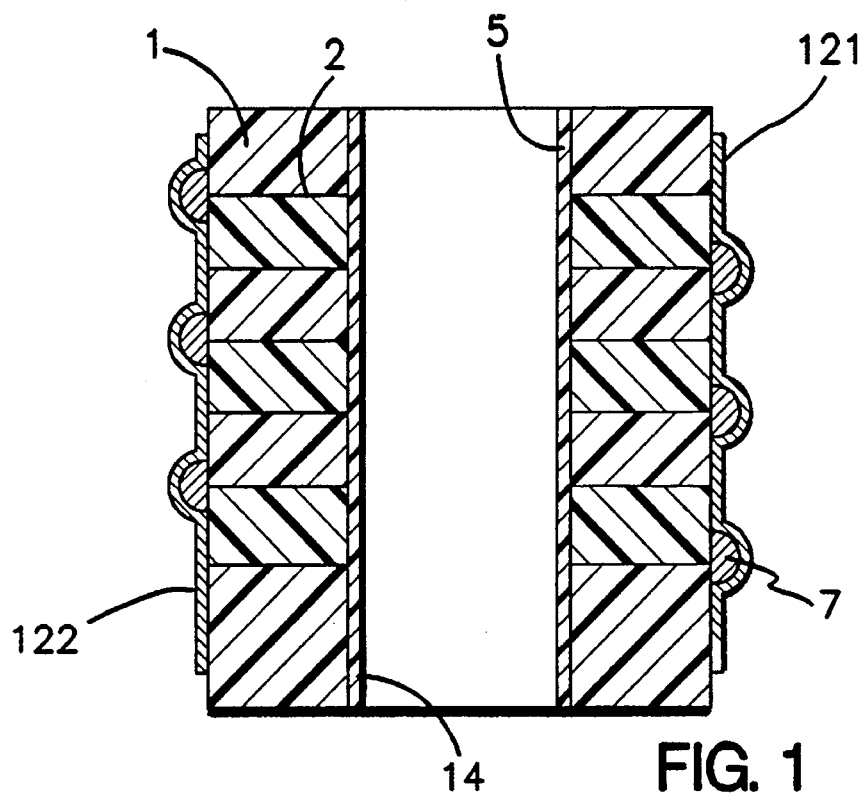
FIG. 1 is a vertical sectional view of a prior art piezoelectric actuator.
Figure 6:
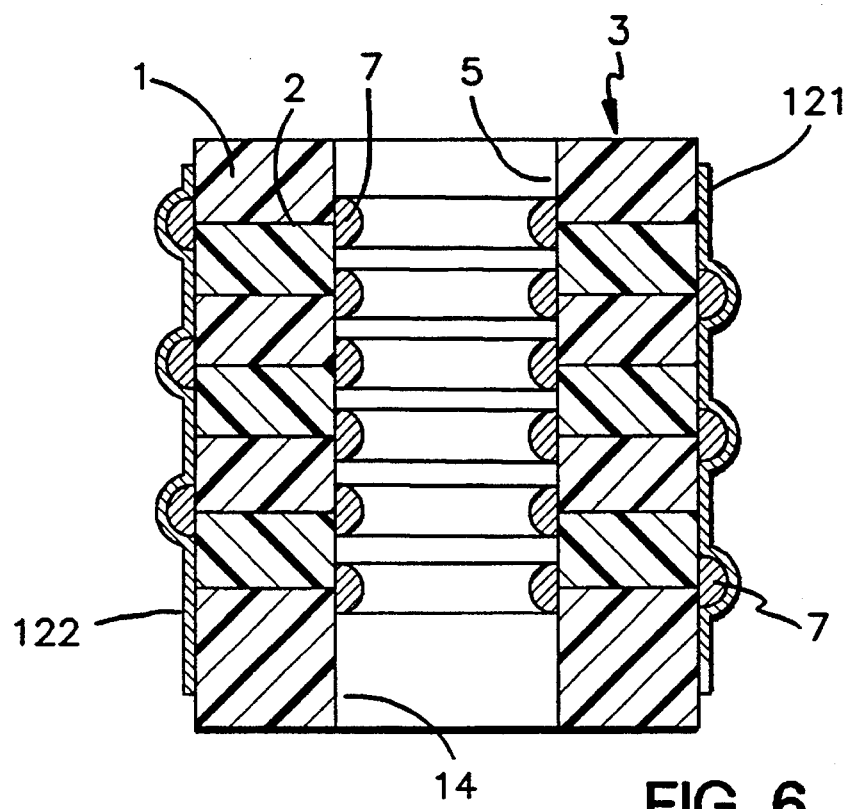
FIG. 6 is a sectional view taken along line D—D of FIG. 5.
Figure 5:
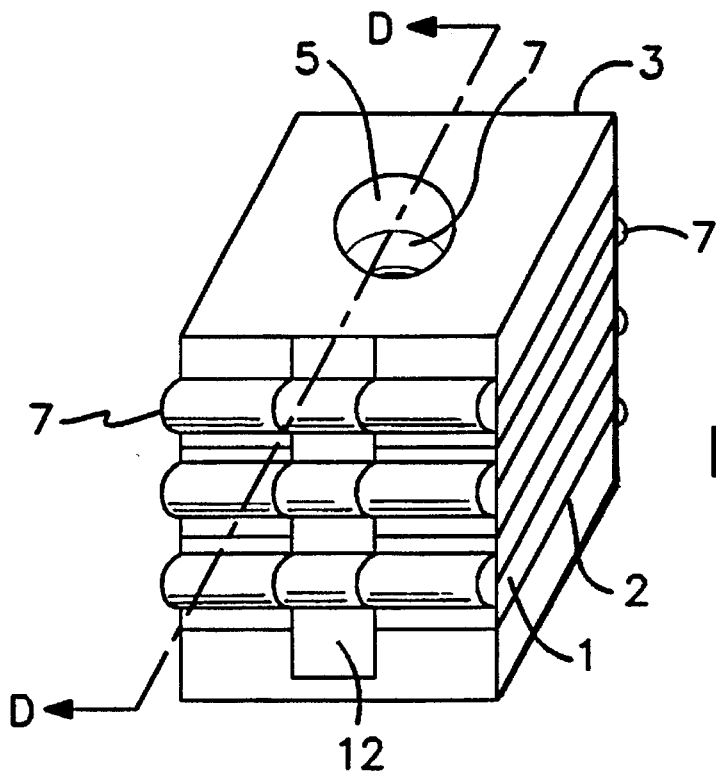
FIG. 5 is a perspective view of a piezoelectric actuator obtained according to the present invention.

As a result of these operations, the exposed internal electrodes 2 are covered by the insulators 71 and 72 alternately for every other layer, on the opposing surfaces where the internal electrodes of the laminated body 3 are exposed, as shown in FIG. 5 and FIG. 6. Moreover, the internal electrodes 2 exposed to the air on the inner surfaces of the holes are all covered with the insulators 71 and 72.

Figure 7:
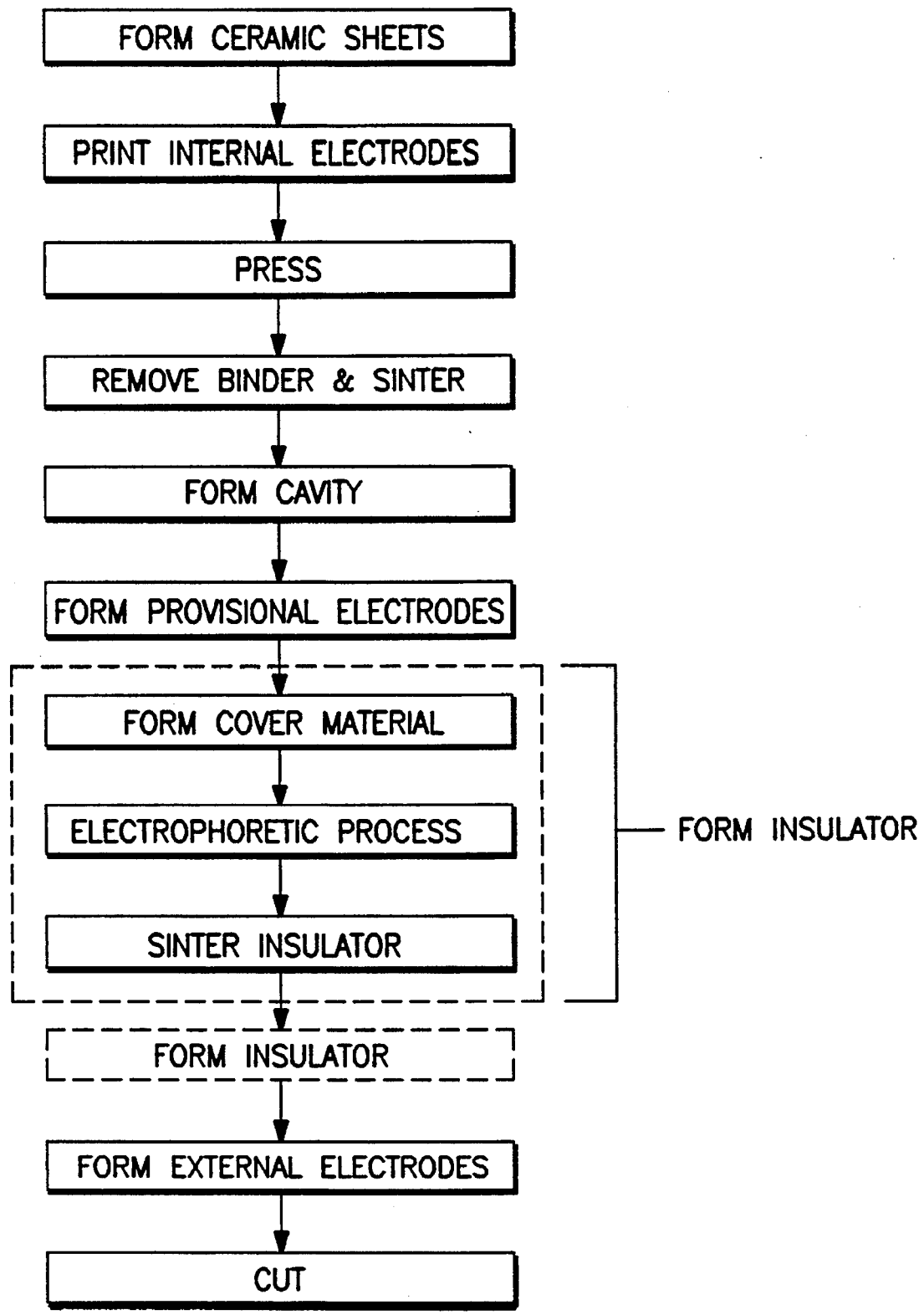
FIG. 7 is a flow chart of a method for manufacturing the embodiment of the present invention.

Next, external electrodes 121 and 122 are formed by using a conductor paste on the respective opposing surfaces on which are formed the insulators 71 and 72 for every other layer of the laminated body 3, in the direction perpendicular to that of the internal electrodes 2. Then a plurality of piezoelectric actuators are manufactured by cutting the laminated body 3 between the adjacent holes 5. One of those piezoelectric activators is shown in FIG. 5 and FIG. 6. The foregoing processes can be shown in a flow chart as shown in FIG. 7.

Figure 8:
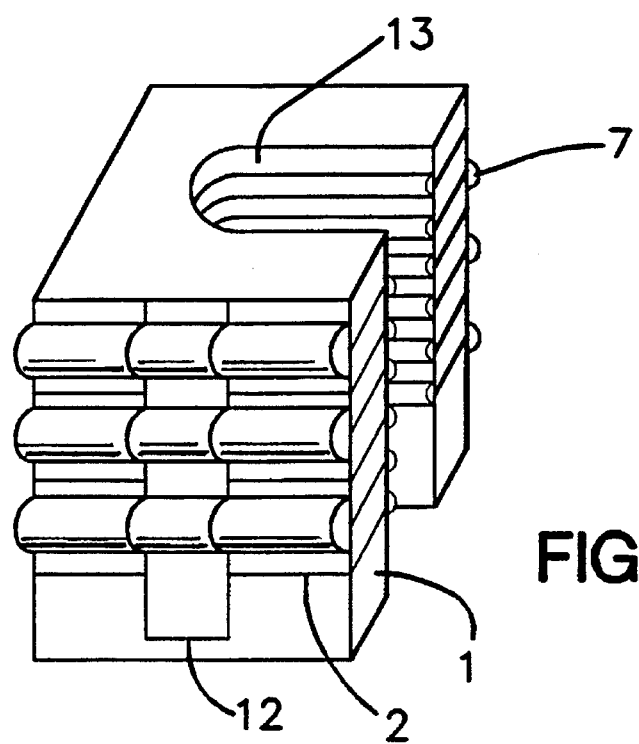
FIG. 8 is a perspective view of another embodiment of the present invention.

In another embodiment, the holes 5 maybe of oval or eliptical shape. Then, if the laminated body 3 is cut at the center of the oval or eliptical holes, it is possible to obtain piezoelectric actuators having a generally U-shaped cutout 13 as shown in FIG. 8.

Although the insulator on the outer surface and the insulator on the inner surface are formed at the same time in this embodiment, it is of course possible to form them in separate processes using different materials. Further, in manufacturing a piezoelectric actuator having the semicircle cutout, an insulator can be formed on the wall surface of the cutout by the same method described above by forming a cutout rather than a hole in the process in FIG. 2A.

As described in the above, in this invention, an insulator is formed on the wall surface of the cylindrical or semicircle cavity by using electrophoretic process so that the following advantages can be obtained.

The formation of the insulator on the wall surface of the cylindrical cavity is achievable at a faster rate of speed and in a larger quantity than in the formation according to the conventional low pressure CVD method.

Namely, in this invention, the formation of the insulator with a thickness of 50 μm on the wall surface of the cylindrical cavity can be completed in about one minute and simultaneous formation for 30 units of the laminate is feasible. Moreover, by the electrophoresis method, the insulator can be deposited selectively in the vicinity of the exposed end faces of the internal electrodes so that there occurs no problem of deposition of the insulator on unwanted surfaces, and a countermeasure against such a possibility is unnecessary.

Furthermore, the insulator formed by the electrophoresis method is selectively deposited especially in the vicinity of the exposed end faces of the internal electrodes on the wall surface of the cylindrical cavity. Accordingly, when the piezoelectric actuator is expanded in its thickness direction by the application of a voltage to the piezoelectric actuator, the tensile stress acting on the insulator is far smaller compared with the case of the stress of the silica film formed according to the low pressure CVD method disclosed in the above-mentioned Laid Open Patent Application. As a result, an enhancement of the reliability as shown in the following Table 1 is obtained.

TABLE 1

Result of Moisture Resistant Load Test
Test Sample: Thickness of the piezoelectric ceramic layer:
100 μm (after sintering)
Number of piezoelectric ceramic layers: 100
External dimensions: 5 m × 5 m × 15 mm (length)
Cylindrical cavity: diameter of 3.0 mm

| Drive Condition | | | Life (normalizing low-pressure CVD method to 1.0) | |
|---|---|---|---|---|
| Voltage (V) | Temp. (C.°) | Humidity (%) | Low Press, CVD meth. | Electrophoresis |
| 150 | 40 | 40 | 1.0 | 1.0 |
| 150 | 40 | 60 | 1.0 | 1.5 |
| 150 | 40 | 90 | 1.0 | 5.0 |

Although the invention has been described with reference to a specific embodiment, this description is not meant to be construed in a limiting sense. Various modifications of the disclosed embodiment, as well as other embodiments of the invention, will become apparent to persons skilled in the are upon reference to the description of the invention. It is therefore contemplated that the appended claim will cover any modifications or embodiments as fall within the true scope of the invention.

We claim:

1. A method of manufacturing a piezoelectric actuator comprising steps of:

forming a laminated body by alternately laminating a plurality of piezoelectric ceramic layers and internal electrode layers such that end parts of every other internal electrode layers are exposed on one surface of a pair of opposing side surfaces of said laminated body;

providing a cavity in said laminated body, said cavity extending across said plurality of piezoelectric ceramic layers and internal electrode layers;

forming a first insulator on selected exposed ends of internal electrode layers on outside surfaces of said laminated body; and forming a second insulator on exposed ends of said internal electrode on an internal surface of said cavity by using a electrophoretic process.

2. The method of manufacturing a piezoelectric actuator as claimed in claim 1, wherein said first insulator is formed by said electrophoretic process.

3. The method of manufacturing a piezoelectric as claimed in claim 2, wherein said cavity is formed prior to the formation of said first insulator and wherein said first and second insulators are simultaneously formed.

4. The method for manufacturing a piezoelectric actuator as claimed in claim 1, further comprising a step of cutting said laminated body along and extending direction of said cavity after the formation of said second insulator.

5. The method of manufacturing a piezoelectric actuator as claimed in claim 1, further comprising a step of cutting said cavity including the cylindrical cavity along a length of said cavity after the formation of said second insulator so as to form a groove on the piezoelectric actuator.

6. The method of manufacturing a piezoelectic actuator as claimed in claim 1, wherein said first and second insulators are formed of at least one of an inorganic material and a polymer material.

7. The method of manufacturing a piezoelectric actuator as claimed in claim 6, wherein said inorganic material is a material selected from the group consisting of glass, silica, ceramic compounds that make up at least part of the piezoelectric body, zirconia, titania and a polymer material.

8. The method of manufacturing a piezoelectric actuator as claimed in claim 6, wherein said polymer material is a polyimide.

* * * * *